(12) United States Patent
Shi

(10) Patent No.: US 10,192,906 B2
(45) Date of Patent: Jan. 29, 2019

(54) TOUCH DISPLAY SUBSTRATE AND MANUFACTURING METHOD THEREOF

(71) Applicants: Boe Technology Group Co., Ltd., Beijing (CN); Ordos Yuansheng Optoelectronics Co., Ltd., Inner Mongolia (CN)

(72) Inventor: Dawei Shi, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 119 days.

(21) Appl. No.: 15/513,967

(22) PCT Filed: May 23, 2016

(86) PCT No.: PCT/CN2016/082961
§ 371 (c)(1),
(2) Date: Mar. 23, 2017

(87) PCT Pub. No.: WO2017/173714
PCT Pub. Date: Oct. 12, 2017

(65) Prior Publication Data
US 2018/0175080 A1 Jun. 21, 2018

(30) Foreign Application Priority Data
Apr. 7, 2016 (CN) .......................... 2016 1 0214204

(51) Int. Cl.
*H01L 27/12* (2006.01)
*G06F 3/041* (2006.01)
*G06F 3/044* (2006.01)

(52) U.S. Cl.
CPC .......... *H01L 27/1288* (2013.01); *G06F 3/044* (2013.01); *G06F 3/0412* (2013.01);
(Continued)

(58) Field of Classification Search
CPC ............... H01L 27/1288; H01L 27/124; H01L 27/1248; G06F 3/0412; G06F 3/044; G06F 2203/04103
See application file for complete search history.

(56) References Cited

U.S. PATENT DOCUMENTS

2012/0056664 A1* 3/2012 Nam ..................... G06F 3/044
327/517
2013/0285079 A1* 10/2013 Hayashi ................. H01L 33/44
257/88
(Continued)

FOREIGN PATENT DOCUMENTS

CN 103558712 A 2/2014
CN 104536611 A 4/2015
(Continued)

OTHER PUBLICATIONS

International Search Report for International Application No. PCT/CN2016/082961 dated Jan. 1, 2017.
(Continued)

*Primary Examiner* — A. Sefer
(74) *Attorney, Agent, or Firm* — Calfee, Halter & Griswold LLP

(57) ABSTRACT

Embodiments of the present disclosure provide a touch display substrate and manufacturing method thereof. The method includes forming a touch signal line on a base substrate through patterning process; depositing a photoresist layer, and forming a first thickness photoresist layer, a second thickness photoresist layer and a photoresist layer opening area through patterning process, the touch signal line being located in the photoresist layer opening area; depositing a first insulating layer on the photoresist layer, the first insulating layer comprising a first area and a second area, wherein the first area is located on the first thickness photoresist layer, the second area is located on the second thickness photoresist layer and the photoresist layer opening area, the first area and the second area of the first insulating layer are disconnected; removing the photoresist layer and the first insulating layer located on the photoresist layer; and depositing a second insulating layer.

20 Claims, 3 Drawing Sheets

(52) U.S. Cl.
CPC ........ *H01L 27/124* (2013.01); *H01L 27/1248* (2013.01); *G06F 2203/04103* (2013.01)

(56) References Cited

U.S. PATENT DOCUMENTS

| | | | |
|---|---|---|---|
| 2014/0360855 A1* | 12/2014 | Kim ........................ | G06F 3/044 200/600 |
| 2015/0062454 A1* | 3/2015 | Hao ........................ | G06F 3/044 349/12 |
| 2017/0017131 A1* | 1/2017 | Aoki ................. | G02F 1/136259 |

FOREIGN PATENT DOCUMENTS

| | | | |
|---|---|---|---|
| CN | 104750347 | A | 7/2015 |
| KR | 20130011794 | A | 1/2013 |
| KR | 20130021871 | A | 3/2013 |
| KR | 20130033627 | A | 4/2013 |

OTHER PUBLICATIONS

First Office Action for Chinese Patent Application No. 201610214204.4 dated Mar. 1, 2018.

\* cited by examiner

TOUCH DISPLAY SUBSTRATE AND MANUFACTURING METHOD THEREOF

RELATED APPLICATIONS

The present application is the U.S. national phase entry of PCT/CN2016/082961, with an international filing date of May 23, 2016, which claims the benefit of Chinese Patent Application No. 201610214204.4, filed Apr. 7, 2016, the entire disclosures of which are incorporated herein by reference.

TECHNICAL FIELD

The present disclosure relates to the field of touch display technology, particularly to a touch display substrate and a manufacturing method thereof.

BACKGROUND

With rapid development of the display technology, the touch screen panel has gradually become a part of people's everyday life. At present, the touch screen panel can be divided into Add on Mode Touch Panel, On Cell Touch Panel and In Cell Touch Panel according to composition structure. The In Cell Touch Panel embeds a touch electrode of the touch panel within the liquid crystal display panel, which not only reduces the thickness of the whole module, but also reduces manufacturing cost of the touch panel greatly. Therefore, the In Cell Touch Panel is favored by panel manufacturers. The In-Cell touch scheme generally includes self-capacitive manner and mutual capacitive manner.

For a liquid crystal display panel of an ADS mode, the self-capacitive manner can be described as follows. The metal layer on the liquid crystal display panel that serves as the common electrode is divided into blocks (i.e., electrode blocks). The blocks can be used as touch sensor units. The touch sensor is connected with a driving IC through a particular touch signal line. When a finger touches the liquid crystal display panel, it will cause fluctuation of the capacitance value of the touch sensor at the corresponding position or the voltage value of the divided common electrode. The driving IC can determine the position of the touch point by testing the fluctuation of the capacitance value, thereby implementing the touch function.

At present, there are various design schemes of the touch signal line in the self-capacitance touch products. As shown in FIG. 1, after the common electrode 02 is divided into blocks, a third insulating layer 03 is formed. Then a touch signal line 04 is formed through patterning process. Afterwards, an insulating layer 12 is further deposited. Finally, the touch signal line 04 and the common electrode 02 are bridged by use of a connection line 14 through punching, so as to enable the touch signal line 04 to play the role of an electrode block lead. Generally, the depth of the via hole a is greater than that of the via hole b, so it requires a longer etching time to etch the via hole a. Hence, if the two via holes need to be etched at a time, the relatively shallow via hole b on the touch signal line 04 may be easily over-etched, which may results in damage of the touch signal metal line layer.

In order to achieve a better etching effect, a relatively thin insulating layer needs to be formed between the pixel electrode and the common electrode. Meanwhile, an insulating layer of a certain thickness is maintained on the touch signal metal line. Thus, on the one hand, it can ensure that the insulating layer covers the touch signal metal line better so as to reduce the over-etching risk. On the other hand, the storage capacitance is increased, so as to ensure a better display effect. However, if dry etching is used to etch a large area of insulating layer located outside the touch signal metal line area so as to reduce the thickness thereof, there will be a great difficulty in carrying out the process, and it will be difficult to etch it completely and the uniformity is poor. Hence, a small size of insulating layer residual cannot be formed through normal depositing, exposing and dry etching.

SUMMARY

Therefore, it is desired to provide a touch display substrate and a manufacturing method thereof, so as to ensure a certain thickness of insulating layer on a touch signal metal line and perform thinning processing to the insulating layer at other positions. Thus, a storage capacitance can be increased effectively and etching time of a via hole can be balanced.

According to an aspect, an embodiment of the present disclosure provides a manufacturing method of a touch display substrate, comprising the steps of:

forming a touch signal line on a base substrate through patterning process;

depositing a photoresist layer, and forming a first thickness photoresist layer, a second thickness photoresist layer and a photoresist layer opening area through patterning process, the touch signal line being located in the photoresist layer opening area;

depositing a first insulating layer on the photoresist layer, the first insulating layer comprising a first area and a second area, wherein the first area is located on the first thickness photoresist layer, the second area is located on the second thickness photoresist layer and the photoresist layer opening area, the first area and the second area of the first insulating layer are disconnected;

removing the photoresist layer and the first insulating layer located on the photoresist layer; and depositing a second insulating layer.

In some embodiments, a thickness of the first thickness photoresist layer is larger than a thickness of the second thickness photoresist layer.

In some embodiments, the photoresist layer comprises a positive photoresist, and forming a first thickness photoresist layer, a second thickness photoresist layer and a photoresist layer opening area through patterning process comprises: exposing and developing the deposited photoresist layer by a mask plate comprising a light shielding area, a completely light-transmissive area and a partially light-transmissive area; and forming the first thickness photoresist layer, the second thickness photoresist layer and the photoresist layer opening area through etching, the first thickness photoresist layer corresponding to the light shielding area of the mask plate, the second thickness photoresist layer corresponding to the partially light-transmissive area of the mask plate, and the photoresist layer opening area corresponding to the completely light-transmissive area of the mask plate.

In some embodiments, the mask plate is a halftone mask plate.

In some embodiments, a thickness of the first insulating layer is larger than a thickness of the second insulating layer, and the thickness of the second insulating layer is equal to the thickness of the touch signal line.

In some embodiments, the touch signal line is made of a metal material, and materials of the first insulating layer and the second insulating layer are both silicon nitride.

In some embodiments, the method, prior to the step of forming a touch signal line on a base substrate through patterning process, further comprises steps of:

providing a base substrate;

forming a thin film transistor element layer on the base substrate, the thin film transistor element layer comprising a gate metal layer and a source-drain metal layer, the gate metal layer comprising a gate electrode and a plurality of gate lines, and the source-drain metal layer comprising a source, a drain and a plurality of source lines;

forming a common electrode layer on the thin film transistor element layer, patterning the common electrode layer so as to form a plurality of individual common electrodes; and forming a third insulating layer on the common electrodes and the thin film transistor element layer.

In some embodiments, the method, after the step of depositing a second insulating, further comprises steps of:

forming a first via hole above the common electrode through etching, the first via hole penetrating the second insulating layer and the third insulating layer and exposing at least part of the common electrode, and forming a second via hole above the touch signal line through etching, the second via hole penetrating the first insulating layer and the second insulating layer and exposing at least part of the touch signal line;

forming a pixel electrode on the second insulating layer, an orthographic projection of the pixel electrode on the base substrate and an orthographic projection of the common electrode on the base substrate at least partly overlap; and forming a connection line through patterning process, the connection line being electrically connected with the common electrode through the first via hole and being electrically connected with the touch signal line through the second via hole.

According to another aspect, an embodiment of the present disclosure further provides a touch display substrate, and the touch display substrate is manufactured by the above method.

In some embodiments, the touch display substrate can be an array substrate of a touch display device.

BRIEF DESCRIPTION OF THE DRAWINGS

In order to explain technical solutions of embodiments of the present disclosure more clearly, the drawings of the embodiments will be described briefly in the following. Apparently, the drawings described below only relate to some embodiments of the present disclosure rather than limitations to the present disclosure.

DETAILED DESCRIPTION OF THE DISCLOSURE

Figure 1:
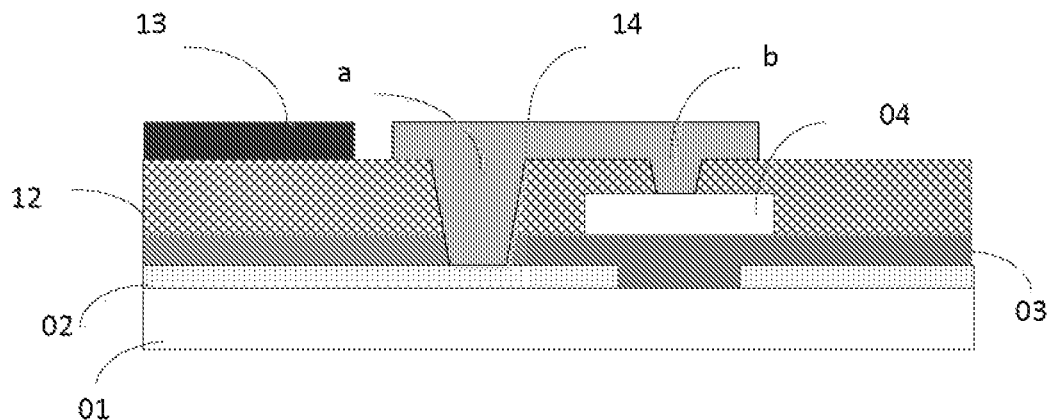
FIG. 1 is a sectional view of an array substrate of a touch display device manufactured by an existing process.

Next, specific implementations of the touch display substrate and the manufacturing method thereof provided by embodiments of the present disclosure will be explained in detail. The thicknesses and the shapes of respective films in the drawings do not reflect the real proportions, which only aims to schematically explaining the contents of the present disclosure.

Firstly, a base substrate is provided. A thin film transistor element layer is formed on the base substrate. The thin film transistor element layer comprises a gate metal layer and a source-drain metal layer. The gate metal layer comprises a gate electrode and a plurality of gate lines. The source-drain metal layer comprises a source, a drain and a plurality of source lines. In the drawings, reference sign 01 is used for generally representing the base substrate on which the thin film transistor element layer is formed.

Figure 2A:
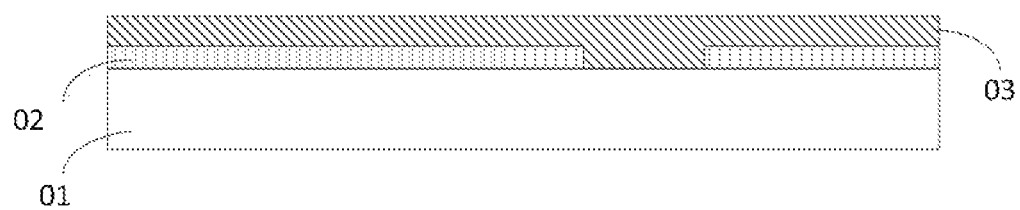
FIGS. 2a-2g are schematic sectional views of steps of a manufacturing method of a touch display substrate provided by an embodiment of the present disclosure.

A common electrode layer is formed on the thin film transistor element layer. The common electrode layer is patterned so as to form a plurality of individual common electrodes 02. A third insulating layer 03 is formed on the common electrodes and the thin film transistor element layer. The upper surface of the third insulating layer 03 is flat. The topography formed after this step is as shown in FIG. 2a.

Figure 2B:
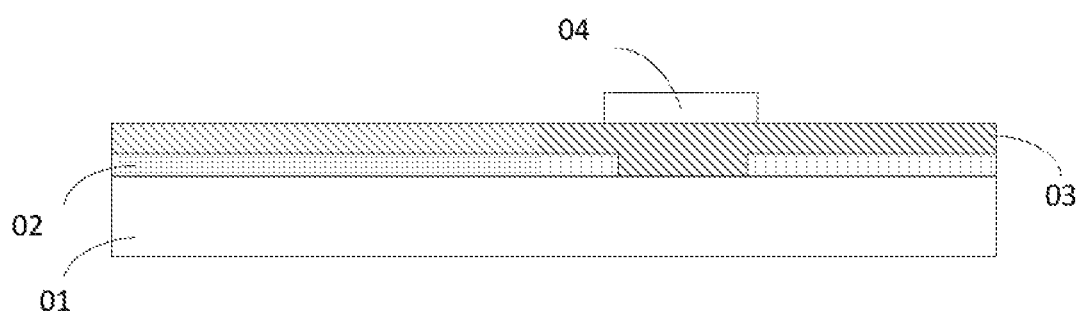

Then, a touch signal line is formed on the base substrate through patterning process. For example, a touch signal line metal layer can be manufactured on the base substrate by use of magnetron sputtering process. The material of the touch signal line metal layer generally uses metals such as molybdenum, aluminum, Al—Ni alloy, molybdenum tungsten alloy, chromium, or copper, and can also use combination of the above materials. Subsequently, a touch signal line 04 is formed on a predetermined area through processes for example exposing and developing. The topography formed after this step is as shown in FIG. 2b.

Figure 2C:
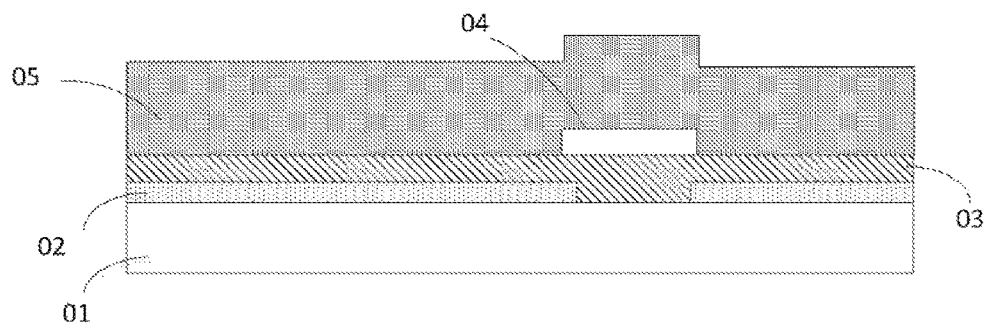
Figure 2D:
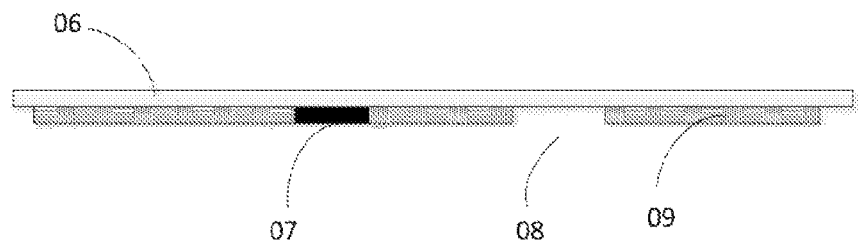
Figure 2D:
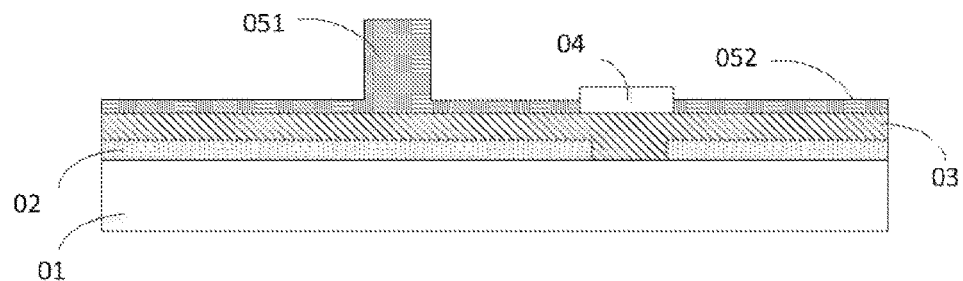

Then, a photoresist layer is deposited, and a first thickness photoresist layer, a second thickness photoresist layer and a photoresist layer opening area are formed through patterning process. The touch signal line is located in the photoresist layer opening area. More specifically, as shown in FIG. 2c, a photoresist layer 05 is deposited. The photoresist layer 05 for example comprises a positive photoresist. Subsequently, as shown in FIG. 2d, the photoresist layer is exposed and developed for example by a halftone mask plate. The halftone mask plate comprises a light shielding area 07, a completely light-transmissive area 08 and a partially light-transmissive area 09 formed on a mask base plate 06. Then, a first thickness photoresist layer 051, a second thickness photoresist layer 052 and a photoresist layer opening area are formed through etching. The first thickness photoresist layer 051 corresponds to the light shielding area 07 of the mask plate, the second thickness photoresist layer 052 corresponds to the partially light-transmissive area 09 of the mask plate, and the photoresist layer opening area corresponds to the completely light-transmissive area 08 of the mask plate. The touch signal line 04 is located in the photoresist layer opening area.

Figure 2E:
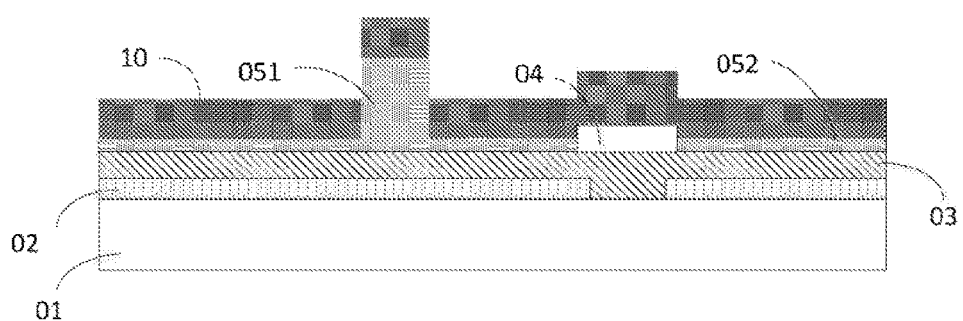

Subsequently, a first insulating layer 10 is deposited on the photoresist layer by use of for example a chemical vapor deposition process. The material of the first insulating layer is generally silicon nitride, and can also use silicon oxide and silicon oxynitride etc. Because the height difference of the first thickness photoresist layer 051 and the second thickness photoresist layer 052 formed through the previous process is larger than the thickness of the first insulating layer 10, after the first insulating layer 10 is deposited, the insulating layer will be naturally divided into two areas due to segment difference. The first area is located on the first thickness photoresist layer 051, and the second area is located on the second thickness photoresist layer 052 and the photoresist layer opening area. The first area and the second area of the first insulating layer 10 are disconnected, so as to expose part of the photoresist layer for facilitating entry of the stripping liquid in the subsequent stripping process. The topography formed after this step is as shown in FIG. 2e.

Figure 2F:
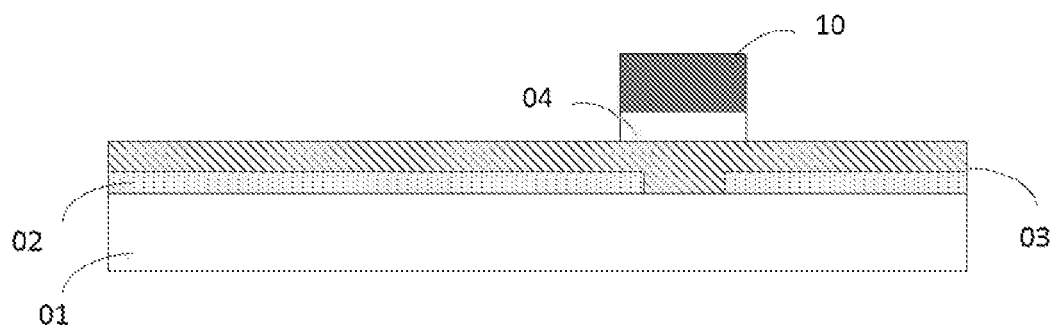

Next, the photoresist layer is removed through for example the lift-off process. The first insulating layer 10 deposited thereon will also be removed therewith, thereby only reserving the first insulating layer 10 on the touch signal line 04, and forming a vertical topography on the side walls thereof, as shown in FIG. 2f. The stripping liquid used in the lift-off process can be acetone, isopropanol, alcohol or a mixed liquor of them.

Figure 2G:
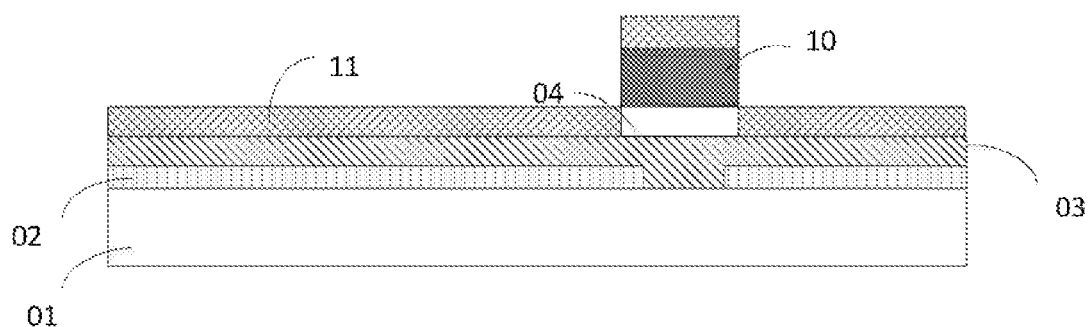

And then, a second insulating layer 11 is deposited. The thickness of the second insulating layer 11 for example is smaller than the thickness of the first insulating layer. The thickness of the second insulating layer 11 can be equal to the thickness of the touch signal line 04. Then, the total thickness of the insulating layer on the touch signal line 04 is the sum of the thicknesses of the first insulating layer 10 and the second insulating layer 11, and the thickness of other portions of the insulating layer is only the thickness of the second insulating layer 11. The topography after this step is as shown in FIG. 2g.

Figure 3:
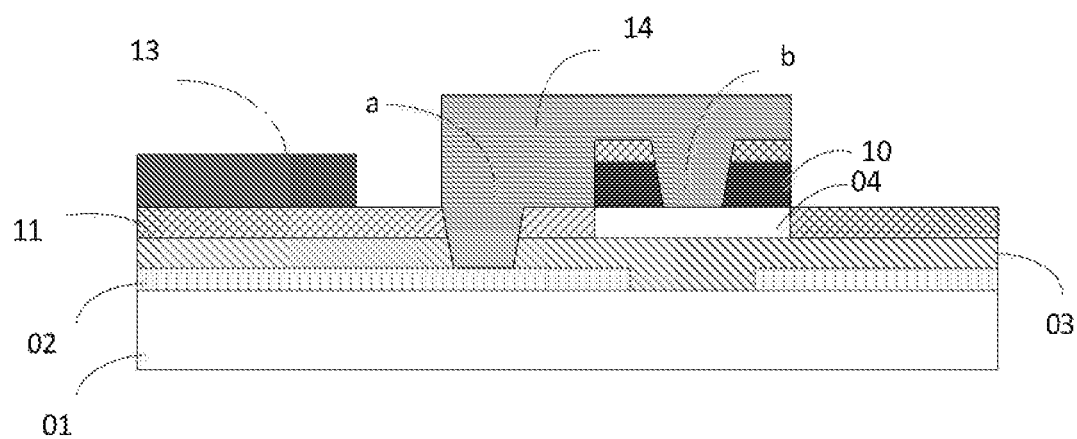
FIG. 3 is a sectional view of a touch display substrate provided by an embodiment of the present disclosure.

As shown in FIG. 3, in actual applications, the following steps can be further comprised after the above processes.

A first via hole a is formed on the common electrode 02 through etching. The first via hole a penetrates the second insulating layer 11 and the third insulating layer 03 and exposes at least part of the common electrode 02. Moreover, a second via hole b is formed on the touch signal line 04 through etching. The second via hole b penetrates the first insulating layer 10 and the second insulating layer 11 and exposes at least part of the touch signal line 04.

A pixel electrode 13 is formed on the second insulating layer 11. An orthographic projection of the pixel electrode 13 on the base substrate and an orthographic projection of the common electrode 02 on the base substrate at least partly overlap.

A connection line 14 is formed through patterning process. The connection line 14 is electrically connected with the common electrode 02 through the first via hole a and is electrically connected with the touch signal line 04 through the second via hole b.

The structure after the manufacturing process of the whole touch display substrate has been finished is for example as shown in FIG. 3. It shows that an insulating layer thinner than that in existing process is formed between the pixel electrode 13 and the common electrode 02 through the manufacturing method of an embodiment of the present disclosure. According to a basic formula of capacitance, the capacitance is inversely proportional to the thickness of the dielectric layer. A thinner insulating layer indicates that a larger storage capacitance can be realized. Therefore, the voltage of a display phase can be maintained sufficiently, so as to ensure normal display of an image. Meanwhile, a relatively thick insulating layer is reserved on the touch signal line 04, so as to cover the touch signal line 04 perfectly. The depths of the via hole a and the via hole b are close, which balances the etching time, reduces the overetching risk and avoids damage to the touch signal line 04.

An embodiment of the present disclosure further provides a touch display substrate. The touch display substrate can be manufactured by methods of the preceding embodiments. One can refer to embodiments of the manufacturing method for the specific structure of the touch display substrate, which will not be repeated here. The touch display substrate for example can be an array substrate of a touch display device.

An touch display substrate and a manufacturing method thereof provided by embodiments of the present disclosure can ensure a certain thickness of insulating layer on a touch signal metal line and perform thinning processing to the insulating layer at other positions. Therefore, on the one hand, the etching time of the via hole is balanced, and the overetching risk is reduced, and thus, damage to the touch signal line is avoided. On the other hand, the storage capacitance is increased and a better display effect is ensured.

Apparently, the skilled person in the art can make various modifications and variations to the present disclosure without departing from the spirit and the scope of the present disclosure. In this way, provided that these modifications and variations of the present disclosure belong to the scopes of the claims of the present disclosure and the equivalent technologies thereof, the present disclosure also intends to encompass these modifications and variations.

The invention claimed is:

1. A manufacturing method of a touch display substrate, comprising steps of:
   forming a touch signal line on a base substrate through patterning process;
   depositing a photoresist layer and forming a first thickness photoresist layer, a second thickness photoresist layer, and a photoresist layer opening area through patterning process, the touch signal line being located in the photoresist layer opening area;
   depositing a first insulating layer on the photoresist layer, the first insulating layer comprising a first area and a second area, wherein the first area is located on the first thickness photoresist layer, the second area is located on the second thickness photoresist layer and the photoresist layer opening area, the first area and the second area of the first insulating layer are disconnected;
   removing the photoresist layer and the first insulating layer located on the photoresist layer; and
   depositing a second insulating layer.

2. The manufacturing method of a touch display substrate according to claim 1, wherein a thickness of the first thickness photoresist layer is larger than a thickness of the second thickness photoresist layer.

3. The manufacturing method of a touch display substrate according to claim 2, wherein the photoresist layer comprises a positive photoresist and wherein the step of forming a first thickness photoresist layer, a second thickness photoresist layer and a photoresist layer opening area through patterning process comprises:
   exposing and developing the deposited photoresist layer by a mask plate comprising a light shielding area, a completely light-transmissive area, and a partially light-transmissive area; and
   forming the first thickness photoresist layer, the second thickness photoresist layer, and the photoresist layer opening area through etching, the first thickness photoresist layer corresponding to the light shielding area of the mask plate, the second thickness photoresist layer corresponding to the partially light-transmissive area of the mask plate, and the photoresist layer opening area corresponding to the completely light-transmissive area of the mask plate.

4. The manufacturing method of a touch display substrate according to claim 3, wherein the mask plate is a halftone mask plate.

5. A touch display substrate, wherein the touch display substrate is manufactured by a method according to claim 3.

6. A touch display substrate, wherein the touch display substrate is manufactured by a method according to claim 2.

7. A touch display substrate, wherein the touch display substrate is manufactured by a method according to claim 4.

8. The manufacturing method of a touch display substrate according to claim 1, wherein a thickness of the first insulating layer is larger than a thickness of the second insulating layer.

9. A touch display substrate, wherein the touch display substrate is manufactured by a method according to claim 8.

10. The manufacturing method of a touch display substrate according to claim 1, wherein the thickness of the second insulating layer is equal to a thickness of the touch signal line.

11. A touch display substrate, wherein the touch display substrate is manufactured by a method according to claim 10.

12. The manufacturing method of a touch display substrate according to claim 1, wherein the touch signal line is made of a metal material.

13. The manufacturing method of a touch display substrate according to claim 1, wherein materials of the first insulating layer and the second insulating layer are both silicon nitride.

14. The manufacturing method of a touch display substrate according to claim 1, wherein the method, prior to the step of forming a touch signal line on a base substrate through patterning process, further comprises steps of:
   providing a base substrate;
   forming a thin film transistor element layer on the base substrate, the thin film transistor element layer comprising a gate metal layer and a source-drain metal layer, the gate metal layer comprising a gate electrode and a plurality of gate lines, and the source-drain metal layer comprising a source, a drain and a plurality of source lines;
   forming a common electrode layer on the thin film transistor element layer, patterning the common electrode layer so as to form a plurality of individual common electrodes; and
   forming a third insulating layer on the common electrodes and the thin film transistor element layer.

15. The manufacturing method of a touch display substrate according to claim 14, wherein the method, after the step of depositing a second insulating layer, further comprises steps of:
   forming a first via hole above the common electrode through etching, the first via hole penetrating the second insulating layer and the third insulating layer and exposing at least part of the common electrode, and forming a second via hole above the touch signal line through etching, the second via hole penetrating the first insulating layer and the second insulating layer and exposing at least part of the touch signal line;
   forming a pixel electrode on the second insulating layer, an orthographic projection of the pixel electrode on the base substrate and an orthographic projection of the common electrode on the base substrate at least partly overlap; and
   forming a connection line through patterning process, the connection line being electrically connected with the common electrode through the first via hole and being electrically connected with the touch signal line through the second via hole.

16. A touch display substrate, wherein the touch display substrate is manufactured by a method according to claim 15.

17. A touch display substrate, wherein the touch display substrate is manufactured by a method according to claim 14.

18. The manufacturing method of a touch display substrate according to claim 1, wherein the photoresist layer and the first insulating layer located on the photoresist layer are removed through lift-off process.

19. A touch display substrate, wherein the touch display substrate is manufactured by a method according to claim 1.

20. The touch display substrate according to claim 19, wherein the touch display substrate is an array substrate of a touch display device.

* * * * *